United States Patent
McCarty et al.

(10) Patent No.: US 6,242,049 B1
(45) Date of Patent: *Jun. 5, 2001

(54) SEALABLE STAGNATION FLOW GEOMETRIES FOR THE UNIFORM DEPOSITION OF MATERIALS AND HEAT

(75) Inventors: Kevin F. McCarty; Robert J. Kee, both of Livermore; Andrew E. Lutz, Alamo; Ellen Meeks, Livermore, all of CA (US)

(73) Assignee: Sandia Corporation, Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/302,155

(22) Filed: Sep. 8, 1994

(51) Int. Cl.[7] .................................................. B05D 1/08
(52) U.S. Cl. .................. 427/446; 427/450; 427/249.8; 427/255.28

(58) Field of Search .............................. 427/248.1, 255.6, 427/577, 585, 590, 249.7, 249.8, 249.1, 255.21, 255.23, 255.28, 255–395, 446, 450; 118/715, 716, 720

(56) References Cited

U.S. PATENT DOCUMENTS

| | | | |
|---|---|---|---|
| 4,798,165 | * | 1/1989 | de Boer et al. . |
| 4,989,541 | * | 2/1991 | Mikoshiba et al. ................. 118/723 |
| 5,209,812 | * | 5/1993 | Wu et al. ............................. 156/613 |

* cited by examiner

*Primary Examiner*—Fred J. Parker
(74) *Attorney, Agent, or Firm*—Donald A. Nissen; Timothy P. Evans

(57) ABSTRACT

The present invention employs a constrained stagnation flow geometry apparatus to achieve the uniform deposition of materials or heat. The present invention maximizes uniform fluxes of reactant gases to flat surfaces while minimizing the use of reagents and finite dimension edge effects. This results, among other things, in large area continuous films that are uniform in thickness, composition and structure which is important in chemical vapor deposition processes such as would be used for the fabrication of semiconductors.

12 Claims, 5 Drawing Sheets

SEALABLE STAGNATION FLOW GEOMETRIES FOR THE UNIFORM DEPOSITION OF MATERIALS AND HEAT

STATEMENT OF GOVERNMENT INTEREST

The government has rights in this invention pursuant to contract no. DE-AC04-94AL8500 between the U.S. Department of Energy and Sandia Corporation.

BACKGROUND OF THE INVENTION

This invention relates generally to the deposition of heat or materials onto a substrate and, more particularly, to the use of constrained stagnation flow geometry, including axisymmetric flow, to achieve efficient uniform deposition.

It is well known to those skilled in the art that certain flow configurations have important similarity properties that render their analysis one-dimensional. Included in this set is stagnation flow. Given that a uniform velocity, uniform temperature and uniform composition inlet flow issues from a manifold a fixed distance above a parallel fixed solid surface which is at uniform temperature, it can be shown that the heat and mass flux to the solid surface will be everywhere uniform regardless of the radial extent of the system. In addition, the gas phase species and temperature profiles are independent of radius. The inherent radial uniformity of a stagnation flow geometry provides an important means for achieving uniform species and heat fluxes to large surface areas. This technology offers a means to uniformly clean and etch surfaces and has application to materials synthesis, such as chemical vapor deposition for the fabrication of semi-conductors and flame synthesis of diamond films all of which require very highly uniform film growth over relatively large areas so that many identical devices can be cut from a single large wafer.

Various methods for introducing and distributing reactant gases as well as use of specialized geometries, such as rotating-disk and fixed-pedestal reactors, have been designed to try to achieve the desired deposition uniformity. The need for both a method of vapor deposition in which the growth rate of the deposited material onto a substrate is highly uniform over the entire area of the substrate and in which the growth rate of the deposited material can be increased as well as the use of stagnation flow as a means for improving chemical vapor deposition of materials and a method for providing uniform gas flow has been disclosed by deBoer, et al. in U.S. Pat. No. 4,798,165. In this instance, the gas carrying deposition materials is constrained to have an axial symmetry by introducing it into the depostion chamber by means of a multiplicity of apertures. In U.S. Pat. No. 5,215,788 Murayama, et al., disclosed that a very uniform deposit could be produced at a growth rate of 60 microns/hr in the chemical vapor depostion synthesis of diamond by the use of a highly strained premixed flat flame stabilized in the stagnation flow regime. While the outermost gas flow is crucial to maintaining the ideal streamlines necessary for stagnation flow, this gas flow does not contribute to development of the deposit. As described above, stagnation flow offers numerous advantages insofar as a means for improving uniformity of distribution of reactants over large area substrates, however, in order for this technique to become practical the inefficiencies in the use of reactants must be overcome.

In addition to the fields of cleaning and etching of surfaces, chemical vapor deposition and material synthesis with flames, the use of strained stagnation flow provides a new route to combustion devices that are energy efficient, in the sense that they are effective in coupling flame generated heat to surrounding surfaces and working media, and offer a means of minimizing emissions by controlling the gas phase combustion process.

In order to achieve energy efficiency in combustion applications effective exchange of heat between the flame gases and the working medium is important, especially for natural gas flames where heat extraction is heavily dependent upon convective heat transfer rather than direct radiation. Because gas inlet velocities can be very high, stagnation flames offer a very effective route to increased heat transfer and, consequently, greater energy efficiency. Fukushima, et al. have used the stagnation flame approach in a steel making application achieving a surface heat flux of approximately 200 kW/m$^2$, almost five times greater than that provided by electric powered radiant tubes.

Because strained stagnation flow permits high gas inlet velocities the flame can be driven very near a heat transfer surface. Since gas velocities can be high, residence times will be correspondingly low and, as a consequence, emissions of $NO_x$ from stagnation flames are low. In addition, as discussed above, surface heat transfer rates can be very high and, consequently, maximum flame temperatures can be reduced, further reducing $NO_x$ emissions. However, as is the case with other applications of stagnation flow, vide supra, gas flow that enters the system beyond a critical radius does not contribute to the combustion process and is, in that sense, wasted.

It is obvious to those skilled in the art, that stagnation flow systems offer both significant advantages in combustion and materials processing and synthesis applications. The only remaining impediment to widespread use of stagnation flow systems is the need to make more efficient use of reactants. Maintaining the desirable properties of stagnation flow coupled with a practical solution to the problem of a more efficient stagnation flow system forms the basis of the invention disclosed herein.

SUMMARY OF THE INVENTION

As indicated above, applications that employ a stagnation flow regime provide numerous advantages such as gas phase species and temperature profiles that are independent of radius, uniform heat and mass fluxes and systems that are amenable to process control, however, there are certain inefficiencies which are inherent in this operating regime, namely, large quantities of fuel or reagent, which although they serve a critical function by supporting the similarity behavior of the rest of the flow field, do not enter the reaction zone and are thus wasted.

Accordingly, it is an object of the present invention to provide method and apparatus to maintain the desirable features inherent in an ideal stagnation flow regime, as described herein, vide supra, while improving the efficiency of these systems insofar as, for example, minimizing the use of gaseous reactants. It is a further object of this invention to provide method and apparatus to maintain the composition of reactants over the surface of the substrate essentially constant in order to maximize the area for uniform deposition of heat or materials. It is yet a further object of this invention to provide a configuration which is inherently scaleable. Still yet another object of this invention is to tailor the composition of the gas flow to meet different needs.

The aforementioned and other objects are accomplished in the present invention by means of specially designed gas or reactant delivery systems or burners which provide for the uniform deposition of materials or heat, are inherently scalable, can be applied to a variety of operating conditions and whose designs are based on calculations of the streamlines of ideal stagnation flow.

These and other objects of the present invention together with the advantages thereof over existing prior art forms which will become apparent to those skilled in the art from detailed disclosure of the present invention as set forth hereinbelow, are accomplished by the improvements herein described and claimed.

BRIEF DESCRIPTION OF THE DRAWINGS

The accompanying drawings, which are incorporated in and form part of the specification, illustrate the present invention and, together with the description, explain the invention.

DETAILED DESCRIPTION OF THE INVENTION

Figure 1:
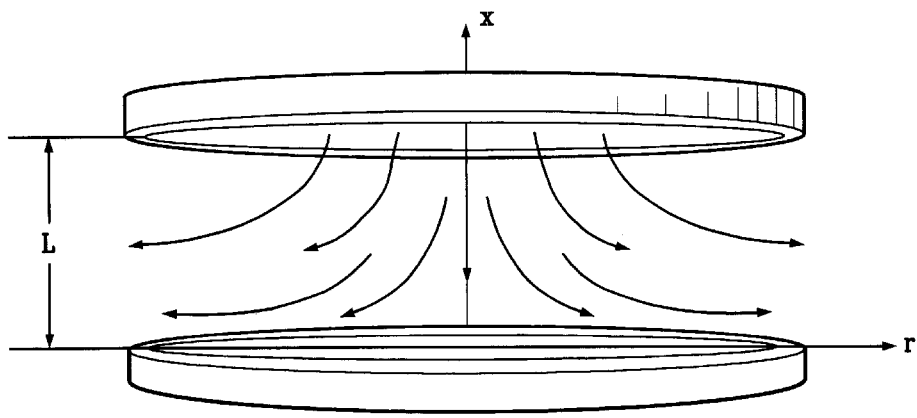
FIG. 1 illustrates the basic concept of a stagnation flow geometry.
Figure 2:
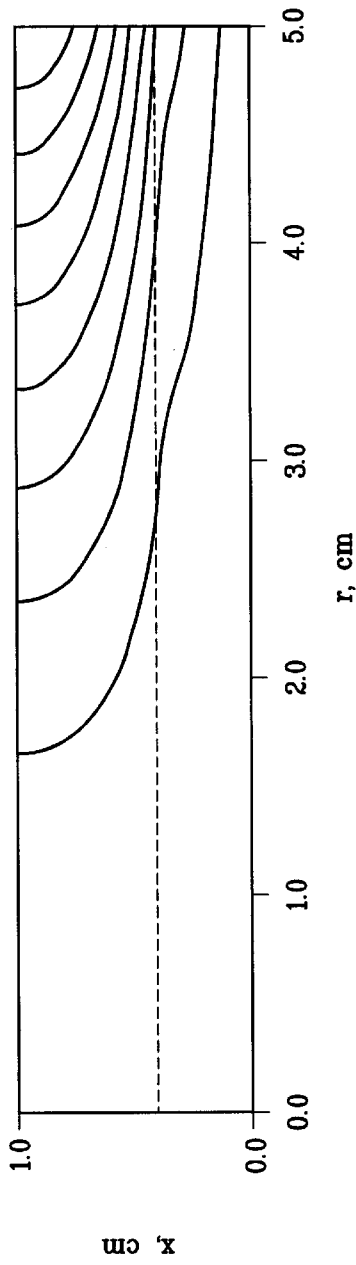
FIG. 2 illustrates streamlines for a two dimensional flow field. The flow enters from the top and the stagnation surface is at the bottom.

FIG. 1 illustrates the basic concept of stagnation flow geometry. Here the temperature and composition fields will be a function only of the dimension x and not of the dimension r. That is, the reaction zone or flame will be flat and parallel to the inlet manifold and substrate surfaces. This concept is shown in more detail in FIG. 2 where streamlines have been computed for a finite size system in which the gas flow rate is 105 centimeters/sec. It is seen here that much of the inlet flow simply turns and exits without crossing the reaction zone front of the finite size substrate. In the case illustrated in FIG. 2, any flow entering the system beyond a radius of about 3 centimeters does not enter the reaction zone. This is the dividing streamline that determines a critical radius at the inlet plane; any inlet flow at a smaller radius passes through the reaction zone. However, the flow that enters beyond the critical radius does serve a purpose; it supports the similarity of behavior in the rest of the flow field. If the inlet flow outside the critical region were to be stopped the reaction zone would no longer remain parallel to the stagnation plane over the entire radius of the substrate. It is the recognition that it is the dividing streamline formed either by the flow of gas or by mechanical means at the boundary of the critical region that is crucial to maintaining the desirable property of stagnation flow coupled with the need to achieve a practical solution to the problem of making this process more efficient insofar as the use of reactants that forms the basis of this invention.

Figure 3:
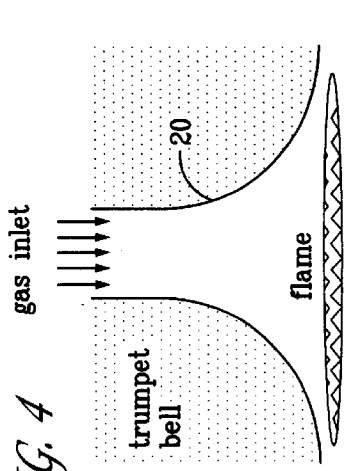
FIG. 3 is a representation of the coflow geometry.
Figure 4:
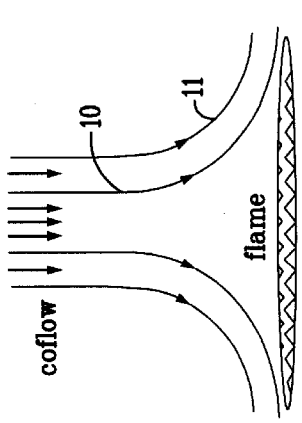
FIG. 4 is a representation of the trumpet bell geometry.

Referring now to the drawings that illustrate the preferred embodiments of this invention. In FIGS. 3 and 4 we illustrate two practical solutions to the problem of avoiding the emission of unreacted gas while retaining the overall desirable feature of the stagnation stabilized reaction zone. These are termed the coflow geometry, FIG. 3, and the trumpet bell geometry, FIG. 4. Both these designs are inherently scalable concepts for the uniform depostion of materials and heat.

In the coflow concept, FIG. 3, there is an inner region of reagent gases 10 whose streamlines intercept the diffusion boundary, or in the case of a combustion apparatus, the flame front. Surrounding the inner flow is an outer flow of gas (coflow) 11 that forces the inner gas flow to follow the streamlines of an ideal stagnation flow. The coflow gas may be an inert gas, such as helium, nitrogen or argon, in a chemical vapor deposition application thereby minimizing the use of costly reagents. In a combustion application the coflow gas may be a combustible gas, resulting in a diffusion flame at the edges of the primary flame front, thereby helping to stabilize the flat flame. All that is necessary is that the momentum flux of the inert gas match that of the reactant gas stream it replaces.

In the trumpet bell concept, FIG. 4, a radially uniform gas flow, produced by means of a contraction nozzle, a manifold or other means known to those skilled in the art, issues into an axisymetric form resembling a trumpet bell. The contour of the trumpet bell 20 follows the shape of the dividing streamline to maintain ideal stagnation flow. While the trumpet bell serves the same function as the outer flow in the coflow concept discussed above, the shape of the bell must be designed such that it takes in account the boundary layer that develops at the no-slip wall of the bell.

To maintain the properties of an ideal stagnation flow, the walls of the trumpet bell should have a contour defined by a streamline that intersects a point at the edge of the reactive layer of gas above the substrate. This point is defined by the intersection of a line at the height where the reactive boundary layer begins and the targeted outer radius of the substrate. To a first approximation, we determine the defining streamline from the solution of stagnation-flow equations. Equations (1) through (7) below describe the one-dimensional steady-state formulation for chemically reacting stagnation flow. Equation (1) describes the bulk continuity of the gas mixture and Eqs. (2) and (3) describe the radial and circumferential momentum balances. For the case of a non-rotating substrate, where there is no circumferential velocity, all terms in Eq. (3) are identically zero. Species mass continuity is governed by Eq. (4) which balances species production (destruction) by chemical reaction with convective and diffusive transport. Equation (5) is the energy equation for the gas mixture including thermal conduction, convection, diffusion, chemical production, and radiation loss terms.

$$\frac{1}{\rho}\frac{\partial \rho}{\partial t} = -\frac{\partial u}{\partial x} - 2V - \frac{u}{\rho}\frac{\partial \rho}{\partial x} = 0 \tag{1}$$

$$\rho\frac{\partial V}{\partial t} = \frac{\partial}{\partial x}\left(m\frac{\partial V}{\partial x}\right) - \rho u\frac{\partial V}{\partial x} - \rho(V^2 - W^2) - \Lambda = 0 \tag{2}$$

-continued $$\rho \frac{\partial W}{\partial t} = \frac{\partial}{\partial x}\left(\mu \frac{\partial W}{\partial x}\right) - \rho u \frac{\partial W}{\partial x} - 2\rho V W = 0 \qquad (3)$$

$$\rho \frac{\partial Y_k}{\partial t} = -\frac{\partial (\rho Y_k V_k)}{\partial x} - \rho u \frac{\partial Y_k}{\partial x} + M_k \dot{\omega}_k = 0 \quad (k = 1, \ldots, K_g) \qquad (4)$$

$$\rho c_p \frac{\partial T}{\partial t} = \frac{\partial}{\partial x}\left(\lambda \frac{\partial T}{\partial x}\right) - \rho u c_p \frac{\partial T}{\partial x} - \sum_{k=1}^{K_g} \rho c_{pk} Y_k V_k \frac{\partial T}{\partial x} - \qquad (5)$$

$$\sum_{k=1}^{K_g} \dot{\omega}_k M_k h_k - \varepsilon_g \sigma (T^4 - T_b^4) - \varepsilon_g \sigma (T^4 - T_s^4) = 0$$

$$\Lambda = \frac{1}{r}\frac{dp_m}{dr} = \text{constant}; \quad \frac{d\Lambda}{dx} = 0 \qquad (6)$$

$$P = \rho RT \qquad (7)$$

In these equations, u is the bulk axial velocity, r is the mean gas density, m is viscosity, T is the gas temperature, $c_p$ is the mean (constant pressure) specific heat of the mixture, and l is the mean thermal conductivity. V and W are the scaled radial and circumferential bulk velocities, where $V(x) \equiv v/r$ and $W(x) \equiv w/r$ are assumptions of the similarity transformation. $Y_k$ is the mass fraction of species k and $V_k$ is the diffusion velocity of species k. Also for species k, $M_k$, $h_k$ and $c_{pk}$ are the molecular weight, specific enthalpy and constant-pressure specific heat, respectively, while $\dot{w}_k$ is the molar production rate by chemical reaction.

A software package for modeling one dimensional rotating-disk stagnation flow chemical vapor depostion reactors, based on the equations set forth above, has been developed Coltrin et al., Sandia National Laboratories Report SAND91-8003, May 1993, which may be used to calculate the appropriate shape of the trumpet bell for a given application.

In order for those skilled in the art to more readily understand the present invention, the following example is given showing a method of application; namely, growing a uniform diamond film by flame synthesis.

EXAMPLE 1

Figure 5:
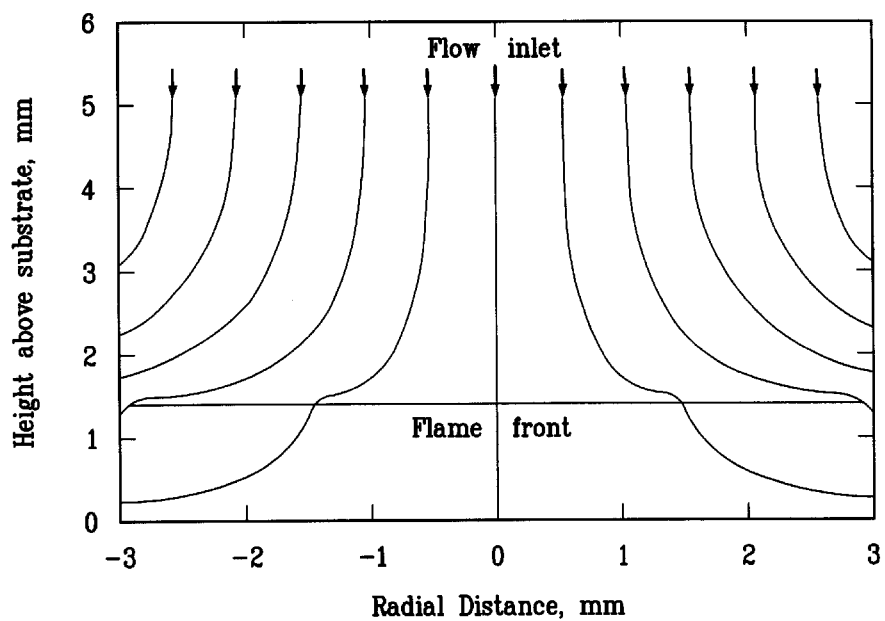
FIG. 5 shows the streamlines of ideal stagnation flow calculated for the flame synthesis of diamond. The horizontal dashed line represents the location of a finite radius substrate stabilized flame.
Figure 6:
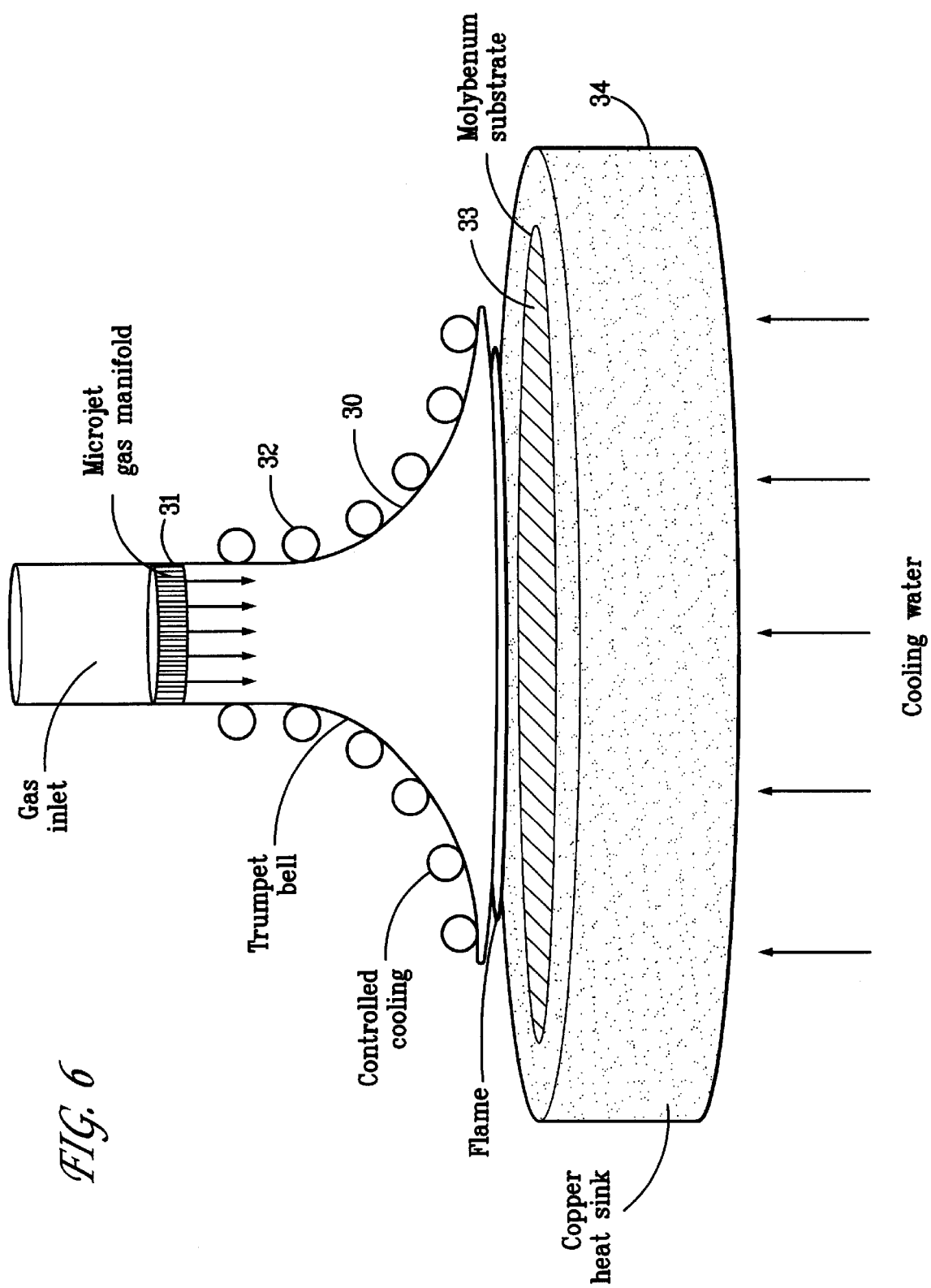
FIG. 6 shows a schematic illustration of a burner whose design is based on the concepts embodied in this invention. This design was used to produce uniform films of diamond.
Figure 7:
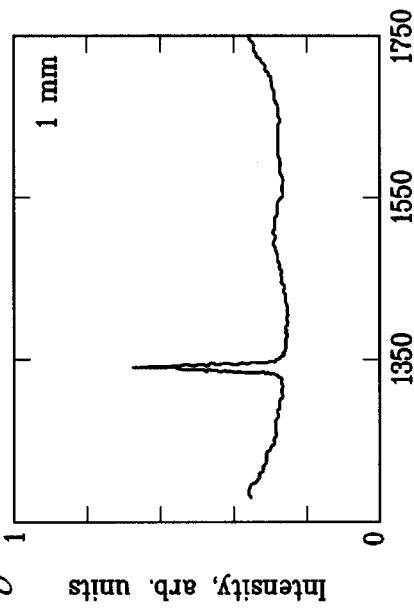
FIGS. 7–10 show the Raman spectra of diamond films produced by the burner illustrated in FIG. 6. These spectra are shown at various radial distances the center of the film. All spectra have the same intensity scale and were obtained using the 496.5 nm laser line of an argon ion laser.
Figure 8:
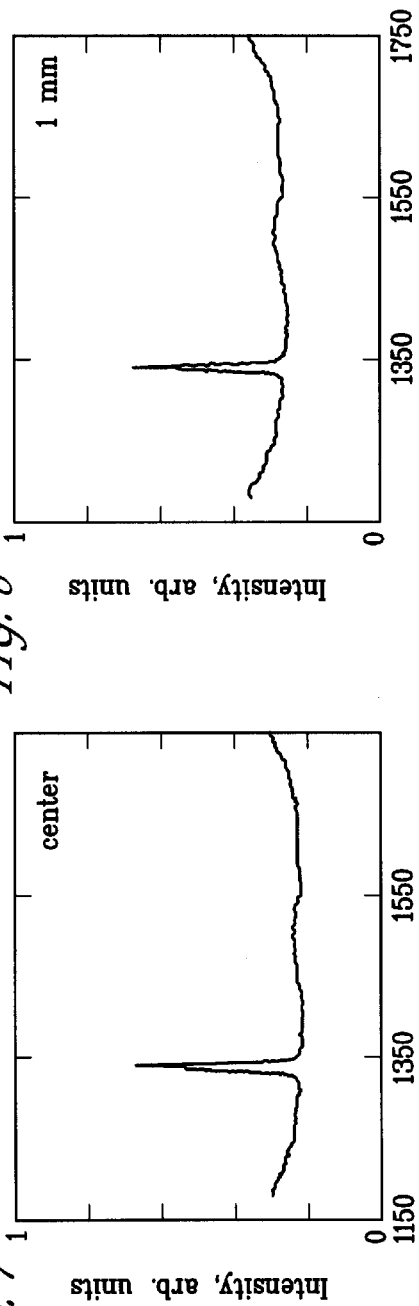
Figure 9:
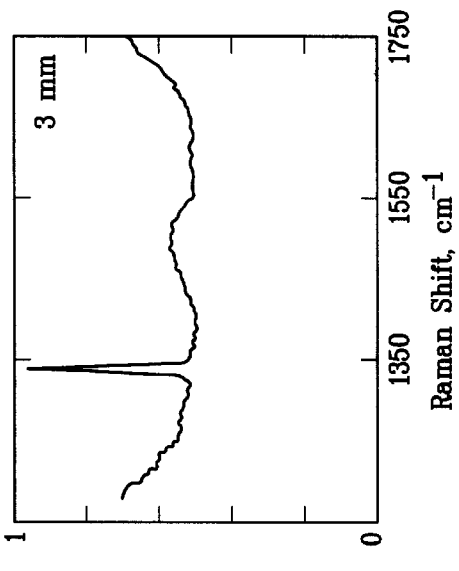
Figure 10:
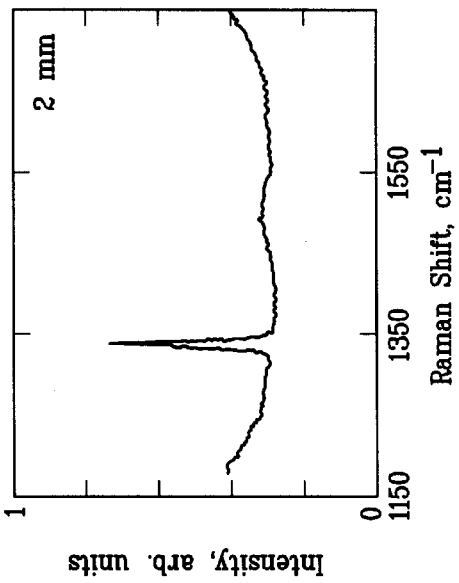
Figures 11, 12, 13, 14:
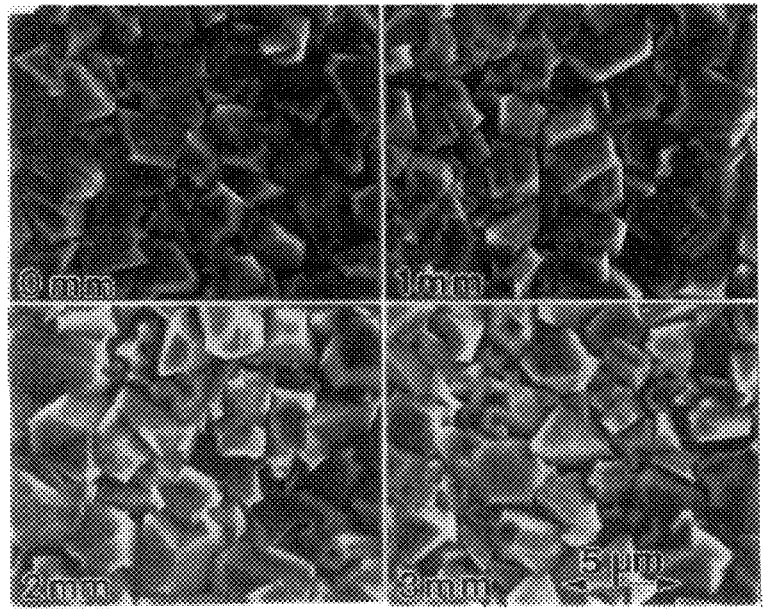
FIGS. 11–14 show scanning electron micrographs of a diamond film at various radial distances from the center of the diamond film. This film was formed as part of an experiment to demonstrate the preferred embodiment of this invention.

The experimental arrangement illustrated in FIG. 6 was used to prepare a uniform diamond film. Calculations simulating the synthesis of diamond for this particular experimental situation in a stagnation flow flame were done, including detailed descriptions of both the gas phase combustion and diamond growth, using the software package discussed earlier, vide supra. The stagnation flow streamlines resulting from this calculation are shown in FIG. 5. Based on these results, a trumpet shaped burner 30 was constructed from brass with a shape that approximated the streamline at radius 1 millimeter as illustrated in FIG. 5. A uniform flow at the inlet of the trumpet bell was achieved using a gas manifold 31. This manifold, which consisted of a 2 millimeter thick disk having a periodic array of circular holes which run perpendicular to the plane of the disk and are arranged in a honeycomb pattern, was placed inside the 2 millimeter diameter inlet of the trumpet bell. Each of the numerous 25 micron diameter holes acted as an individual gas jet, and the combination gave a flow directed toward the substrate where the flow velocity was independent of radius. Such flow uniformity is absolutely critical in obtaining a uniform flame. For example, without the microjet manifold, a nonuniform annulus-shaped flame results from the radially varying pipe flow at the bell inlet. Uniformity of the gas temperature was achieved by controlling the bell temperature using water cooling 32. Diamond films were grown at atmospheric pressure on a scratched molybdenum substrate 9.5 millimeter in diameter 33 placed at a distance of 5.5 millimeter from the microjet manifold outlet. The temperature of the substrate was measured by a thermocouple (not shown) positioned in a well 1 millimeter from the flame-exposed surface. The molybdenum substrate was held in a copper block 34 which itself was water cooled. Total flow of premixed feed gas was 8.8 standard liters/min with the ratios $C_2H_2/H_2=0.97$ and $H_2/O_2=0.57$. A flat flame was found to be stabilized about 1 millimeter above the substrate. The flame was about 5–6 millimeter in diameter, about 3 times the diameter of the gas inlet, in good agreement with the fluid-flow simulations.

In FIGS. 7–10 we show the Raman spectra of a diamond film deposited for 30 minutes on the molybdenum substrate 33 using the trumpet bell burner 30 shown in FIG. 6. The peak at 1338 $cm^{-1}$, FIG. 7, et seq., from the first-order phonon scattering of diamond establishes the synthesis of diamond. There is no phonon scattering structure observed between about 1550 and 1580 $cm^{-1}$ indicating the absence of $sp^2$-bonded carbon in the Raman spectra. The intensity of the diamond phonon is relatively constant between r=0–3 millimeters, FIGS. 7–10, but the background luminescence is greater at r=3 millimeters, FIG. 10. The Raman spectral data show that only the diamond form of carbon was produced in this experiment.

Examination of the diamond film by scanning electron microscope was used to determine the uniformity of the film. As shown in the scanning electron microscopy images of FIGS. 11–14, the diamond film morphology is radially uniform between r=0–3 millimeter. The scanning electron microscopy images showed a diamond film which was continuous, where the size of the crystallites was the same and the shapes of the crystalline faces were identical.

This example serves to illustrate the fact that reactants in a stagnation flow regime constrained in the manner described by this invention can achieve high deposition and heat flux uniformity on a finite scale, thereby optimizing use of reactant gases and maximizing the area for uniform deposition of materials. It is included to illustrate an operation of the preferred embodiment and is not meant to limit the scope of the invention. The scope of the invention is only limited by the following claims. Many variations will be apparent to those skilled in the art that would be encompassed by the scope of the present invention.

We claim:

1. A method for minimizing the consumption of reactant species in a gas deposition process, comprising the steps of:

a.) causing a reactant gas to flow into a gas reactor about a central axis of a gas inlet, creating a flow directed substantially perpendicular to a substrate planar surface such that a stable axisymmetric staganation gas flow is established radially across and generally parallel with said planar surface, said reactant gas entering said inlet having a substantially uniform and radially invariant temperature, velocity and composition, and axisymmetric stagnation gas flow delivering a radially uniform material flux to said planar surface;

b.) maintaining said substrate at a substantially uniform temperature;

c.) constraining said axisymmetric stagnation gas flow to within a critical radius as said reactant gas exits said gas inlet thereby providing a constrained axisymmetric stagnation gas flow, said constrained gas flow bounded by a boundary streamline at said critical radius;

d.) placing said substrate at a fixed distance from said gas inlet such that a reaction zone is established proximal to, and parallel with, said planar surface, said reaction zone extending radially outward to said boundary streamline; and e.) adjusting said critical radius such that said boundary streamline intercepts an edge of said substrate planar surface thereby establishing a maximum deposition area while minimizing consumption of said reactant gas during said gas deposition process.

2. The method of claim 1 wherein said step of constraining further comprises surrounding said axisymmetric stagnation gas flow with an outer coaxial gas flow having a momentum flux equal to a momentum flux of said axisymmetric stagnation gas flow thereby providing said constrained axisymmetric stagnation gas flow, said outer coaxial gas flow supporting said constrained stagnation gas flow such that said constrained gas flow maintains ideal stagnation flow, said outer coaxial gas flow and said constrained stagnation gas flow divided at said boundary streamline.

3. The method of claim 2 wherein the outer coaxial flow gas is selected from a group consisting of helium, nitrogen and argon or combinations thereof.

4. The method of claim 2 wherein the outer coaxial flow gas is a combustible gas.

5. The method of claim 1 wherein the reactant gas comprises chemical vapor deposition materials suitable for deposition of films.

6. The method of claim 1 wherein the reactant gas comprises a combustible gas.

7. The method of claim 1 wherein the reactant gas is a mixture of at least one hydrocarbon gas and an oxidizing gas useful for the formation of a diamond film.

8. The method of claim 1 wherein said boundary streamline is maintained by means of a fixture whose shape conforms to the shape of said boundary streamline.

9. The method of claim 7 wherein said hydrocarbon gas is a mixture of acetylene and hydrogen, the mixture of acetylene and hydrogen being in the volume percent ratio of about 1, wherein said oxidizing gas is oxygen, the volume percent ratio of hydrogen and oxygen being about 0.6 and wherein the total flow rate of said gas mixture is about 9 standard liters/min.

10. The method of claim 1, wherein the deposition process is a combustion process.

11. The method of claim 10, wherein said reaction zone comprises a flat flame.

12. The method of claim 11,wherein said stagnation gas flow stabilizes said flat flame.

* * * * *